(12) United States Patent
Ishii et al.

(10) Patent No.: US 9,778,765 B2
(45) Date of Patent: Oct. 3, 2017

(54) DISPLACEMENT SENSOR INCLUDING A VOLTAGE CONVERTING UNIT THAT CONTAINS A RESISTOR CONNECTED TO A PIEZOELECTRIC ELEMENT

(71) Applicant: MURATA MANUFACTURING CO., LTD., Nagaokakyo-shi, Kyoto-Fu (JP)

(72) Inventors: Toru Ishii, Nagaokakyo (JP); Yasushi Yamamoto, Nagaokakyo (JP); Tsutomu Yonemitsu, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 579 days.

(21) Appl. No.: 14/339,875

(22) Filed: Jul. 24, 2014

(65) Prior Publication Data

US 2014/0331791 A1    Nov. 13, 2014

Related U.S. Application Data

(63) Continuation of application No. PCT/JP2013/051530, filed on Jan. 25, 2013.

(30) Foreign Application Priority Data

Jan. 25, 2012  (JP) ................. 2012-012839

(51) Int. Cl.
*G01L 1/10*    (2006.01)
*G06F 3/038*   (2013.01)
(Continued)

(52) U.S. Cl.
CPC ............. *G06F 3/038* (2013.01); *G01B 7/003* (2013.01); *G01L 1/16* (2013.01); *G06F 3/0338* (2013.01);
(Continued)

(58) Field of Classification Search
CPC ........ G06F 3/038; G06F 3/0433; G06F 3/041; G06F 2203/04104; G06F 3/0414;
(Continued)

(56) References Cited

U.S. PATENT DOCUMENTS 4,807,482 A    2/1989 Park et al.
5,523,642 A    6/1996 Hashimoto et al.
(Continued)

FOREIGN PATENT DOCUMENTS

JP    S63-266391 A    11/1988
JP    H05-61592 A     3/1993
(Continued)

OTHER PUBLICATIONS

Japanese Office Action issued for counterpart application JP 2013-555315, dispatch dated Sep. 24, 2014 (English translation attached).
(Continued)

*Primary Examiner* — Harshad R Patel
*Assistant Examiner* — Brandi Hopkins
(74) *Attorney, Agent, or Firm* — Arent Fox LLP

(57) ABSTRACT

There is provided a displacement sensor which can precisely detect the amount of displacement given by an operator. A touch sensor which is a type of the displacement sensor has a piezoelectric element, a voltage converting unit and a detecting unit. The piezoelectric element instantaneously generates a voltage proportional to a pressing force (the amount of pressing). The voltage converting unit converts the voltage generated by the piezoelectric element, into a voltage proportional to a transition determined based on a predetermined time constant determined by an impedance of a resistor of the voltage converting unit and capacitances of a capacitor and the piezoelectric element, and a pressing force. The detecting unit integrates output voltages of the
(Continued)

voltage converting unit, and calculates the pressing force (the amount of pressing) based on an integration value.

17 Claims, 6 Drawing Sheets

(51) Int. Cl.
  *G01L 1/16* (2006.01)
  *H01L 41/04* (2006.01)
  *G01B 7/00* (2006.01)
  *G06F 3/0338* (2013.01)
  *H01L 41/113* (2006.01)

(52) U.S. Cl.
  CPC ........ *H01L 41/042* (2013.01); *H01L 41/1134* (2013.01)

(58) Field of Classification Search
  CPC ...... G06F 3/0416; G06F 3/047; G06F 3/0418; G06F 3/044; G06F 2203/04106; G09G 5/003; G09G 2300/0404; G01P 15/11; G01P 15/132; G01P 15/18; G01R 27/2605
  USPC .......... 73/862.61, 862.625, 514.17; 345/174; 702/25
  See application file for complete search history.

(56) References Cited

U.S. PATENT DOCUMENTS

| | | | | |
|---|---|---|---|---|
| 5,794,080 | A | * | 8/1998 | Watanabe .......... G01C 19/5649 310/317 |
| 6,234,032 | B1 | * | 5/2001 | Okumoto .................. G01L 1/08 73/862.68 |
| 6,571,631 | B1 | | 6/2003 | Yamamoto |
| 9,110,532 | B2 | | 8/2015 | Ando et al. |
| 2003/0179387 | A1 | | 9/2003 | Uno et al. |
| 2010/0271326 | A1 | | 10/2010 | Hu et al. |
| 2012/0075245 | A1 | | 3/2012 | Chang et al. |
| 2012/0150452 | A1 | | 6/2012 | Drobkov et al. |
| 2013/0057499 | A1 | | 3/2013 | Ando et al. |
| 2013/0113747 | A1 | | 5/2013 | Aono |

FOREIGN PATENT DOCUMENTS

| | | |
|---|---|---|
| JP | H06-109560 A | 4/1994 |
| JP | 2002-350106 A | 12/2002 |
| JP | 2003-004758 A | 1/2003 |
| JP | 2011-234212 A | 11/2011 |
| JP | 2011-253517 A | 12/2011 |
| TW | 463050 B | 11/2001 |
| TW | 583388 B | 4/2004 |
| TW | 200537384 A | 11/2005 |
| TW | 201039209 A | 11/2010 |
| TW | 201100804 A | 1/2011 |
| TW | 201113794 A | 4/2011 |
| TW | 201203011 A | 1/2012 |
| WO | WO 2011/138903 A1 | 11/2011 |

OTHER PUBLICATIONS

Written Opinion and International Search Report issued on PCT/JP2013/051530, dated Feb. 26, 2013.

* cited by examiner (A)

(B)

(C)

US 9,778,765 B2

DISPLACEMENT SENSOR INCLUDING A VOLTAGE CONVERTING UNIT THAT CONTAINS A RESISTOR CONNECTED TO A PIEZOELECTRIC ELEMENT

CROSS REFERENCE TO RELATED APPLICATIONS

The present application is a continuation of PCT/JP2013/051530 filed Jan. 25, 2013, which claims priority to Japanese Patent Application No. 2012-012839, filed Jan. 25, 2012, the entire contents of each of which are incorporated herein by reference.

FIELD OF THE INVENTION

The present invention relates to a displacement sensor which detects the amount of displacement when an operator operates (bends, twists or pushes) a main body.

BACKGROUND OF THE INVENTION

Conventionally, various types of displacement sensors which detect the amounts of displacement when an operator operates a main body have been devised. Operations performed on a main body include bending the main body, twisting the main body and pushing a predetermined surface (a touch surface) of the main body. Various types of touch sensors which detect the amounts of pushing upon touching when an operator touches a flat operation surface by the finger have been devised as touch sensors whose touch surfaces are pushed. For example, Patent Document 1 discloses a touch input device which has a flat pressure-sensitive sensor. A piezoelectric sheet using a piezoelectric body as a material is generally used for such a pressure-sensitive sensor. Further, this piezoelectric sheet is usually used for the various types of current displacement sensors.

The piezoelectric sheet generates a charge corresponding to the amount of displacement, and therefore the amount of displacement (the amount of bending, the amount of twisting or the amount of pushing) is detected by configuring a piezoelectric sensor by forming electrodes opposing both surfaces of the piezoelectric sheet, and detecting voltages from generated charges.

Patent Document 1: JP 5-61592 A

However, a piezoelectric body used for a piezoelectric sheet generates the amount of charge proportional to the amount of displacement, and, when the piezoelectric body continues maintaining the same amount of displacement, the piezoelectric body generates no new charge after generating a certain amount of charges. That is, when an output of the piezoelectric sensor is connected to a load having a fixed input impedance and is observed as a voltage, this voltage instantaneously changes from an initial reference voltage to a voltage value proportional to the amount of displacement, and subsequently returns to the reference voltage without being maintained at a fixed voltage.

According to the conventional configuration, it is not easy to precisely detect (measure) the amount of displacement proportional to charges generated by a piezoelectric sensor due to characteristics of the piezoelectric sensor.

SUMMARY OF THE INVENTION

It is therefore an object of the present invention to provide a displacement sensor which can precisely detect the amount of displacement given by an operator.

A displacement sensor according to the present invention has: a piezoelectric element which generates a charge proportional to an amount of displacement; a voltage converting unit which generates a voltage which changes at a time constant, from the charge generated by the piezoelectric element; and a detecting unit which integrates voltages outputted from the voltage converting unit, and detects the amount of displacement from an integration value.

According to this configuration, it is possible to obtain a voltage value of a stable temporal change according to the amount of change.

Further, the voltage converting unit of the displacement sensor according to the present invention can be realized by the following configuration. Preferably, the voltage converting unit includes a first resistor which is connected to at least one end of the piezoelectric element, and an amplifier circuit which detects, as an input, a voltage generated when the charge generated by the piezoelectric element flows in the first resistor.

Further, the voltage converting unit of the displacement sensor according to the present invention can be realized by the following configuration. Preferably, in the voltage converting unit, the first resistor is connected in parallel with the piezoelectric element, one end of the first resistor is connected with an input of the amplifier circuit, and the other end of the first resistor is connected with a reference potential.

Further, the voltage converting unit of the displacement sensor according to the present invention can be realized by the following configuration. Preferably, in the voltage converting unit, the piezoelectric element, and the first resistor and a second resistor are connected in series, one end of the first resistor is connected with the piezoelectric element, the other end of the first resistor is connected with one end of the second resistor and an input of the amplifier circuit, and the other end of the second resistor is connected with an output of the amplifier circuit.

These configurations indicate specific configuration examples of the voltage converting unit.

Further, preferably, an impedance of the first resistor of the displacement sensor according to the present invention is lower than an impedance of the piezoelectric element.

Furthermore, preferably, a synthetic impedance of the first resistor and the second resistor of the displacement sensor according to the present invention is lower than an impedance of the piezoelectric element.

These configurations indicate specific examples of the impedances of the first resistor and the second resistor. It is possible to obtain a more stable output voltage by setting the impedances in this way.

Further, preferably, the detecting unit of the displacement sensor according to the present invention measures a fluctuation of the integration value, calculates a difference value by calculating a difference between an initial value of the integration value and a latest integration value when detecting that the fluctuation of the integration value shows a behavior of a pair of an increase and a decrease, and resets the integration value to the initial value when the difference value is less than a predetermined threshold.

According to this configuration, it is possible to suppress an influence of a variation of charges generated by the piezoelectric element.

Further, preferably, the piezoelectric element of the displacement sensor according to the present invention includes a piezoelectric film which is made of polylactic acid subjected to stretch processing in at least a uniaxial direction, a first detection electrode which is formed in a first surface of the piezoelectric film, and a second detection electrode which is formed in a second surface of the piezoelectric film.

This configuration indicates an example of a preferable material for the piezoelectric film. Uniaxially stretched polylactic acid has a high piezoelectric constant and a low permittivity. Consequently, it is possible to increase sensitivity to detect the amount of displacement by using polylactic acid for the piezoelectric film. Further, polylactic acid has high translucency similar to acrylic resin, so that it is also possible to realize a displacement sensor having high translucency. Furthermore, polylactic acid does not have pyroelectricity, so that, when the finger touches the surface of the displacement sensor, even if a body temperature is transmitted thereto, the body temperature does not influence a detection voltage of the amount of pushing (pressing force). Consequently, when polylactic acid is used for the piezoelectric film, a complex mechanism which prevents the body temperature from being transmitted does not need to be provided compared to a case where a piezoelectric film having the pyroelectricity such as PVDF is used.

Further, according to the present invention, the displacement sensor can be utilized as a touch sensor which detects a pressing force when a predetermined surface of the piezoelectric element is pressed.

According to the present invention, it is possible to precisely measure the amount of displacement given by an operator.

DETAILED DESCRIPTION OF THE EXEMPLARY EMBODIMENTS

Figure 1:
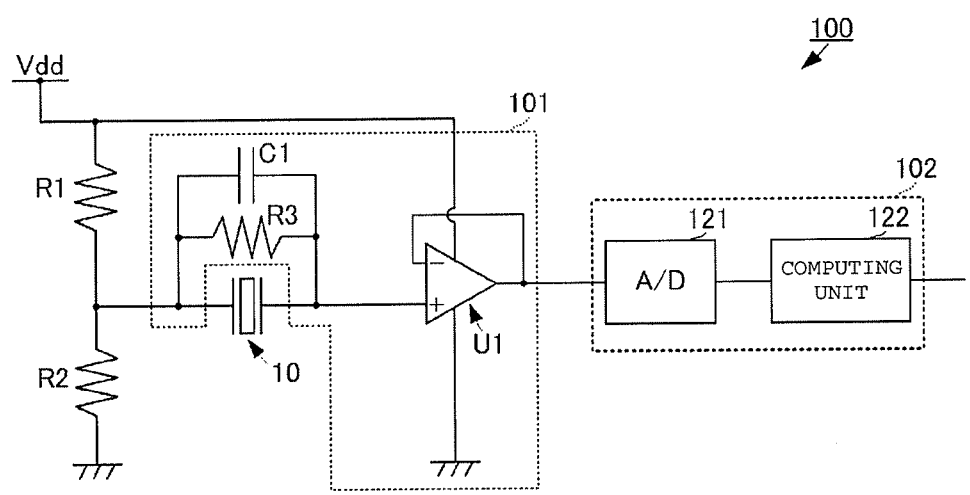
FIG. 1 is a circuit block diagram of a displacement sensor 100 according to a first embodiment of the present invention.

A displacement sensor according to the first embodiment of the present invention will be described with reference to the drawings. In addition, a displacement sensor will be described in the following embodiments using as an example a touch sensor which detects a pressing force (the amount of pushing). FIG. 1 is a circuit block diagram of a touch sensor 100 according to the first embodiment of the present invention.

The touch sensor 100 has a piezoelectric element 10, a voltage converting unit 101 and a detecting unit 102. The voltage converting unit 101 has a resistor R3 (corresponding to a "first resistor" of the present invention), a capacitor C1 and an operational amplifier U1.

One end of the piezoelectric element 10 (e.g. a first lead electrode 41 described below) is connected to a connection point between a resistor R1 and a resistor R2. The resistor R1 and the resistor R2 are connected in series between a drive voltage application terminal Vdd and a ground. The piezoelectric element 10 is connected in parallel with the resistor R3, and is connected in parallel with the capacitor C1. The other end of the piezoelectric element 10 (e.g. a second lead electrode 42 described below) is connected to a non-inverting input terminal of the operational amplifier U1.

The output terminal of the operational amplifier U1 is connected to an inverting input terminal of the operational amplifier U1. This configuration realizes a buffer circuit. The operational amplifier U1 receives a supply of a drive voltage from the drive voltage application terminal Vdd. The output terminal of the operational amplifier U1 is connected to the detecting unit 102.

Figure 2:
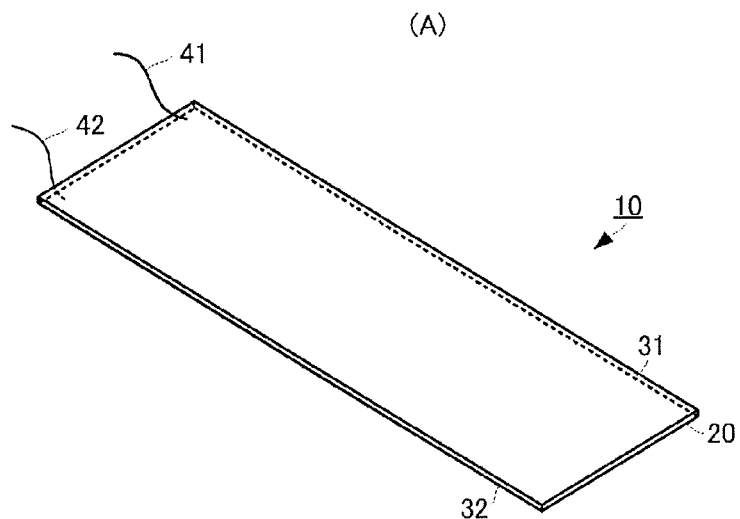
FIGS. 2(A) to 2(C) each are a view illustrating a schematic configuration of a piezoelectric element 10.
Figure 2:
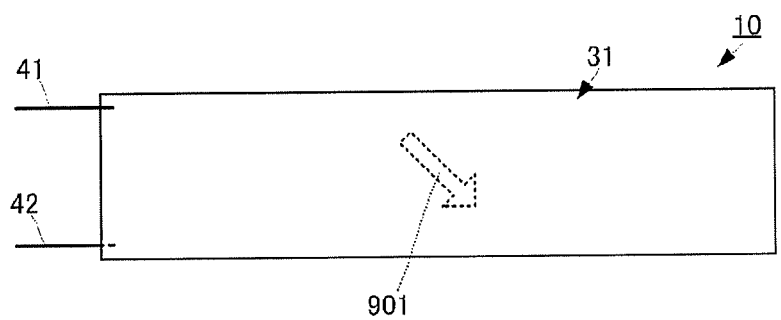
Figure 2:
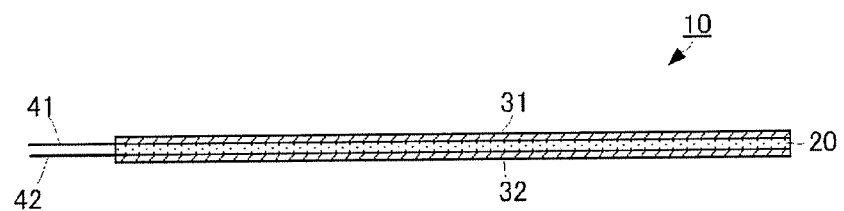

FIGS. 2(A) to 2(C) each are a view illustrating a schematic configuration of the piezoelectric element 10, and FIG. 2(A) is an external perspective view, FIG. 2(B) is a plan view and FIG. 2(C) is a side view.

The piezoelectric element 10 has a piezoelectric film 20, a first detection electrode 31 and a second detection electrode 32.

The piezoelectric film 20 is a rectangular flat film which has a first principal surface and a second principal surface opposing to each other. The piezoelectric film 20 is formed using uniaxially stretched poly-L-lactic acid (PLLA).

PLLA is a chiral polymer, and a main chain has a spiral structure. PLLA generates piezoelectricity when molecules are oriented by uniaxial stretching. A piezoelectric constant of the uniaxially stretched PLLA is very high among polymers.

In addition, a stretching ratio is preferably about three to eight folds. Crystallization of extended-chain crystal of polylactic acid is encouraged by applying thermal processing to the polylactic acid after stretching, and the piezoelectric constant increases. In addition, when biaxial stretching is performed, it is possible to provide the same effect as that of uniaxial stretching by varying stretching ratios of respective axes.

Further, PLLA generates piezoelectricity when processing of orienting molecules by way of stretching is performed, and therefore does not need to be subjected to polling processing unlike other polymers such as PVDF or piezoelectric ceramics. That is, the piezoelectricity of PLLA which does not belong to the ferroelectrics does not appear upon polarization of ions similar to the ferroelectrics such as PVDF and PZT, and derives from the spiral structure which is a characteristic structure of a molecule. Hence, pyroelectricity which occurs in other ferroelectric piezoelectric body does not occur in PLLA. Further, while a piezoelectric constant of PVDF temporally fluctuates and remarkably lowers depending on cases, the piezoelectric constant of PLLA is temporally very stable.

Furthermore, a relative permittivity of PLLA is about 2.5 and very low, and therefore when d is a piezoelectric constant and $\epsilon T$ is a permittivity, a piezoelectric output constant (=piezoelectric g constant and $g=d/\epsilon T$) takes a high value.

In this regard, the piezoelectric g constant of PVDF of permittivity $\epsilon_{33}^T=13\times\epsilon_0$, and piezoelectric constant $d_{31}=25$ pC/N is $g_{31}=0.2172$ Vm/N in accordance with the above expression. Meanwhile, the piezoelectric g constant of PLLA of piezoelectric constant $d_{14}=10$ pC/N is converted into $g_{31}$ and calculated, $d_{14}=2\times d_{31}$ holds, then $d_{31}=5$ pC/N holds and the piezoelectric g constant is $g_{31}=0.2258$ Vm/N. Consequently, by using PLLA of piezoelectric constant $d_{14}=10$ pC/N, it is possible to provide the same sufficient sensitivity to detect the amount of pushing as that of PVDF. Further, the inventors of the present invention experimentally obtained PLLA of $d_{14}=15$ to 20 pC/N, so that it is possible to detect the amount of pushing with very high sensitivity by using the PLLA.

A first detection electrode 31 is formed in the first principal surface of the piezoelectric film 20 made of PLLA having such characteristics. Further, a second detection electrode 32 is formed in the second principal surface of the piezoelectric film 20. One of organic electrodes including ITO, ZnO and polythiophene as main components, organic electrodes including polyaniline as a main component and silver nanowire electrodes is preferably used for the first detection electrode 31 and the second detection electrode 32. It is possible to form electrodes of high translucency by using these materials. In addition, when the translucency is not required, electrodes formed by silver paste or metal electrodes formed by deposition, sputtering or plaiting can also be used.

The first lead electrode 41 is connected to the first detection electrode 31. A second lead electrode 42 is connected to the second detection electrode 32.

Figure 3:
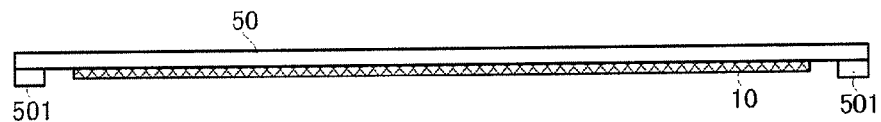
FIGS. 3(A) and 3(B) each are a view for explaining a function of generating a charge when the piezoelectric element 10 is pushed according to the first embodiment of the present invention.
Figure 3:
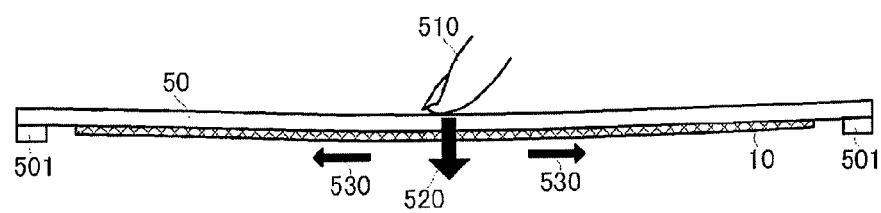

When the flat surface of the piezoelectric element 10 is pushed, a charge is generated and a potential difference is produced between the first detection electrode 31 and the second detection electrode 32. FIGS. 3(A) and 3(B) each are a view for explaining a function of generating a charge when the piezoelectric element 10 is pushed according to the first embodiment of the present invention. FIG. 3(A) illustrates a state where the amount of pushing (pressing force) is not applied, and FIG. 3(B) illustrates a state where the amount of pushing (pressing force) by the finger is applied.

As illustrated in FIG. 3(A), the piezoelectric element 10 is attached to one principal surface of a flat elastic body 50 such that respective flat surfaces are closely attached. The elastic body 50 is formed using glass, acryl or polycarbonate. The material of the elastic body 50 is not limited to the materials disclosed herein, and an adequate material only needs to be selected according to use conditions. Further, an adequate surface only needs to be selected for a surface to which the piezoelectric element 10 is attached, according to use conditions. Both opposing ends of the elastic body 50 are supported by support members 501.

As illustrated in FIG. 3(B), when the surface of the elastic body 50 is pushed by a finger 510, a pressing force indicated by a bold arrow 520 is applied to the elastic body 50. In this case, the elastic body 50 is curved such that the elastic body 50 swells towards the surface on which the piezoelectric element 10 is disposed. By this means, the piezoelectric film 20 of the piezoelectric element 10 is stretched substantially along a longitudinal direction, and a tensile stress indicated by bold arrows 530 is produced. This stress polarizes the piezoelectric film 100 to the first principal surface and the second principal surface. This polarized charge generates a potential difference (voltage) between the first detection electrode 31 and the second detection electrode 32. In this regard, the amount of charge produced from PLLA by polarization is proportional to a pressing force. That is, the potential difference (voltage) generated between the first detection electrode 31 and the second detection electrode 32 is proportional to the pressing force.

Thus, the potential difference (voltage) generated in proportion to the pressing force is instantaneously generated at a timing when displacement occurs, and temporally lowers as described above. However, it is possible to accurately and reliably calculate the pressing force (the amount of pushing) based on an instantaneous change of charges generated by the piezoelectric element 10 and voltages by using the configuration of the present invention.

As described above, the piezoelectric element 10 is connected in parallel with the resistor R3 and the capacitor C1. A resistance value (impedance) of the resistor R3 and a capacitance of the capacitor C1 are adequately set to satisfy the following conditions.

(i) The resistance value of the resistor R3 is lower than the impedance of the piezoelectric element 10.

(ii) A change of an output voltage of the operational amplifier U1 caused by pushing can be detected by the detecting unit 102.

(iii) A temporal change of a transitional voltage of an output voltage of the operational amplifier U1 caused by pushing is sufficiently short compared to a detection cycle at which the touch sensor 100 performs discrete sampling.

In addition, resistance values of the resistors R1 and R2 for providing a reference voltage of the piezoelectric element 10 are set to satisfy $R1\times R2/(R1+R2)\ll R3$.

According to this configuration, when the pressing force is gradually applied to the piezoelectric element 10 and is released after the pressing force is maintained for a certain period of time, the output voltage of the operational amplifier U1 changes as follows.

When the pressing force starts being applied, the output voltage of the operational amplifier U1 is displaced to the voltage proportional to a final pressing force at a timing at which the pressing force is applied. Subsequently, the output voltage lowers to the reference voltage according to a time constant (a value proportional to $R3\times(C1+Cs)$) determined based on the resistance value (impedance) of the resistor R3, the capacitance of the capacitor C1 and the capacitance Cs of the piezoelectric element 10.

Further, when the pressing force starts being released, the output voltage of the operational amplifier U1 is displaced to a voltage corresponding to the pressing force, at a timing at which the pressing force is released. Subsequently, the output voltage lowers to the reference voltage according to a time constant (a value proportional to $R3\times(C1+Cs)$) determined based on the resistance value (impedance) of the resistor R3, the capacitance of the capacitor C1 and the capacitance Cs of the piezoelectric element 10.

Figure 4:
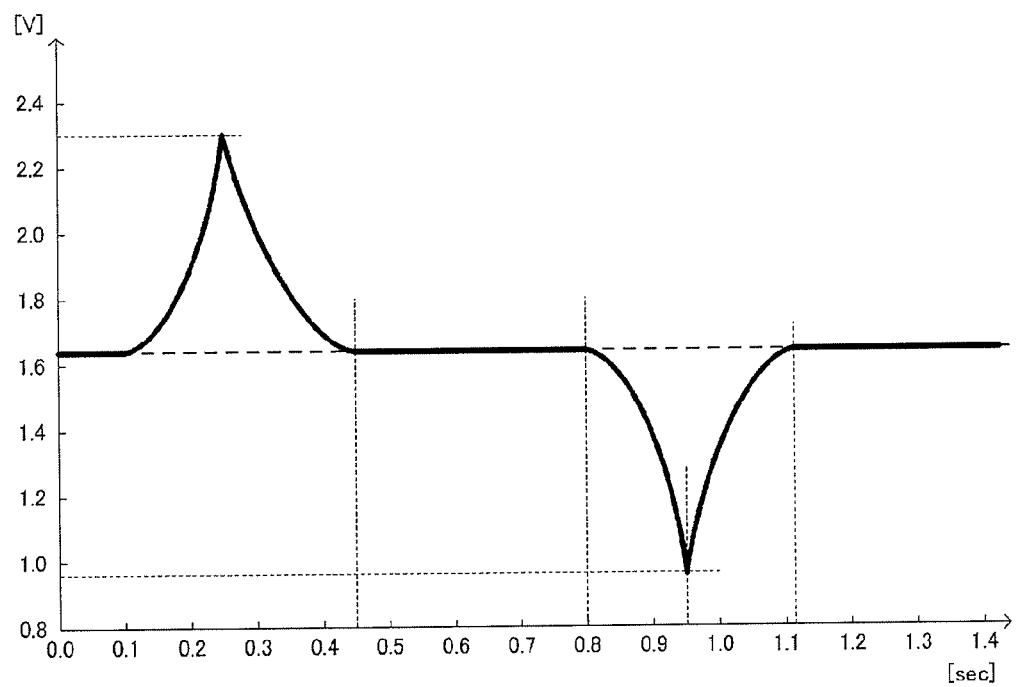
FIG. 4 is a view illustrating an example of a temporal transition of an output voltage of an operational amplifier U1 according to the first embodiment.

In this regard, a voltage change caused when the pressing force is applied and a voltage change caused when the pressing force is released show reverse characteristics with respect to the reference voltage. More specifically, the output voltage of the operational amplifier U1 of the voltage converting unit 101 makes a temporal transition as illustrated in FIG. 4. FIG. 4 is a view illustrating an example of a temporal transition of the output voltage of the operational amplifier U1 according to the present embodiment.

As illustrated in FIG. 4, the pressing force is not applied to the piezoelectric element 10 at time 0.0 sec. to 0.1 sec., and the output voltage is the reference voltage.

When the pressing force is applied to the piezoelectric element 10 at time 0.1 sec. to 0.25 sec., the output voltage rises compared to the reference voltage in proportion to the applied pressing force. Further, when the pressing force does not further increase and is fixed, the output voltage lowers at a time constant based on R3×(C1+Cs), and returns to the reference voltage. In case of, for example, FIG. 4, the output voltage reaches the reference voltage at 0.45 sec. Subsequently, the output voltage keeps the reference voltage and is fixed in a period in which the pressing force is fixed.

When the pressing force applied to the piezoelectric element 10 is released at time 0.8 sec. to 0.95 sec., the output voltage lowers compared to the reference voltage in proportion to the pressing force to be released. Further, when the pressing force is completely released, the output voltage rises at a time constant based on R3×(C1+Cs) and returns to the reference voltage. In case of, for example, FIG. 4, the output voltage reaches the reference voltage at 1.15 sec.

The output voltage which makes the above temporal transition due to the pressing force applied to the piezoelectric element 10 is inputted to the detecting unit 102.

Figure 5:
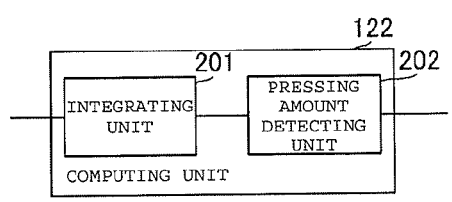
FIG. 5 is a block diagram illustrating a configuration of a computing unit 122 of the displacement sensor 100 according to the first embodiment.

The detecting unit 102 has an A/D converting unit 121 and a computing unit 122. FIG. 5 is a block diagram illustrating a configuration of the computing unit 122.

The A/D converting unit 121 samples an output signal of the operational amplifier U1 at a predetermined sampling cycle and converts the output signal into digital output data. In this regard, the sampling cycle only needs to be adequately set according to the specification of the touch sensor 100, and is set to such a cycle that a voltage change caused by the above pressing force can be adequately detected.

Figure 6:
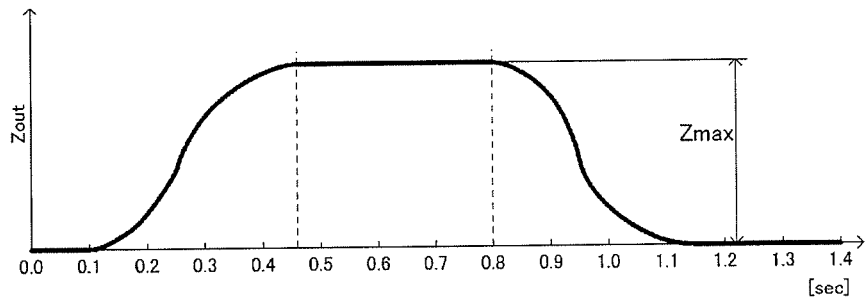
FIG. 6 is a view illustrating a temporal transition of an integration value Zout obtained by the computing unit 122 according to the first embodiment.

The computing unit 122 has an integrating unit 201 and a pressing amount calculating unit 202. The integrating unit 201 integrates difference values between output data and reference voltage data obtained by digitally sampling the reference voltage, per sampling timing, and calculates an integration value Zout. FIG. 6 is a view illustrating a temporal transition of the integration value Zout obtained by the computing unit 122 according to the first embodiment. FIG. 6 illustrates an example where the output voltage transition illustrated in FIG. 4 occurs.

As illustrated in FIG. 6, the integration value Zout starts at nearly 0.0 and continues rising until the output voltage rises when the pressing force starts being applied, and the pressing force becomes fixed and then the output voltage returns to the reference voltage. In this regard, a value which the integration value Zout reaches depends on the pressing force, i.e., the amount of pushing. Subsequently, the integration value Zout continues lowering until the output voltage lowers when the pressing force starts being released and then the output voltage returns to the reference voltage when the pressing force is released, and reaches nearly 0.0. Accordingly, in case of FIG. 6, the integration value Zout continues rising from 0.0 to a predetermined value corresponding to the pressing force by 0.45 sec. The integration value Zout is fixed from 0.45 sec. to 0.8 sec. The integration value Zout continues lowering from the predetermined value from 0.8 sec., and reaches 0.0 at 1.15 sec.

The pressing amount calculating unit 202 detects the integration value Zout, and calculates the amount of pressing based on a relationship between the integration value Zout set in advance and the amount of pressing. In addition, the pressing force as well as the amount of pushing depends on the integration value Zout, so that it is also possible to calculate the pressing force.

By employing this configuration, it is possible to realize a touch sensor which can accurately and reliably detect the amount of pressing and the pressing force.

Figure 7:
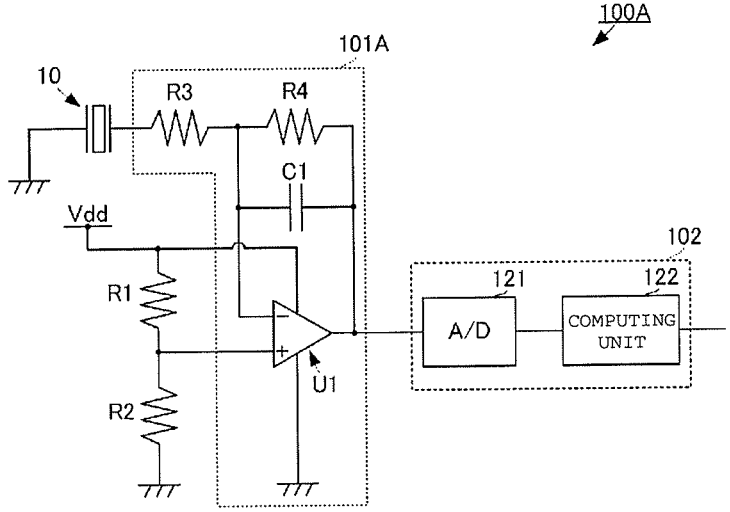
FIG. 7 is a circuit block diagram of the displacement sensor 100 according to the first embodiment of the present invention.

Next, a touch sensor according to the second embodiment will be described with reference to the drawings. FIG. 7 is a circuit block diagram of a touch sensor 100A according to the second embodiment of the present invention. The touch sensor 100A according to the present embodiment differs from a voltage converting unit 101 according to the first embodiment, in a configuration of a voltage converting unit 101A and a connection configuration of a piezoelectric element 10.

The voltage converting unit 101A has an operational amplifier U1, a resistor R3 (corresponding to a "first resistor" of the present invention), a resistor R4 (corresponding to a "second resistor" of the present invention) and a capacitor C1.

A non-inverting input terminal of the operational amplifier U1 is connected to a connection point between a resistor R1 and a resistor R2. The resistor R1 and the resistor R2 are connected in series between a drive voltage application terminal Vdd and a ground. Further, the operational amplifier U1 receives a supply of a drive voltage from the drive voltage application terminal Vdd.

The non-inverting input terminal of the operational amplifier U1 is connected with one end of the resistor R3. The other end of the resistor R3 is connected to one end (e.g. a first lead electrode 41 described above) of the piezoelectric element 10. The other end (e.g. a second lead electrode 42 described above) of the piezoelectric element 10 is connected to a reference potential.

The first capacitor C1 and the resistor R4 are connected between an inverting input terminal and the output terminal of the operational amplifier U1.

According to this configuration, the voltage converting unit 101A functions as an integration circuit to be connected to the piezoelectric element 10.

Resistance values (impedances) of the resistor R3 and the resistor R4 and the capacitance of the capacitor C1 are adequately set to satisfy the following conditions.

(i) A synthetic resistance (R3+R4) of a resistance value of the resistor R3 and the resistor R4 is lower than the impedance of the piezoelectric element 10.

(ii) A change of an output voltage of the operational amplifier U1 caused by pushing can be detected by a detecting unit 102.

(iii) A temporal change of a transitional voltage of the output voltage of the operational amplifier U1 caused by pushing is sufficiently short compared to a detection cycle at which the touch sensor 100 performs discrete sampling.

In addition, the resistance values of the resistors R1 and R2 are set in the same way as in the first embodiment.

Figure 8:
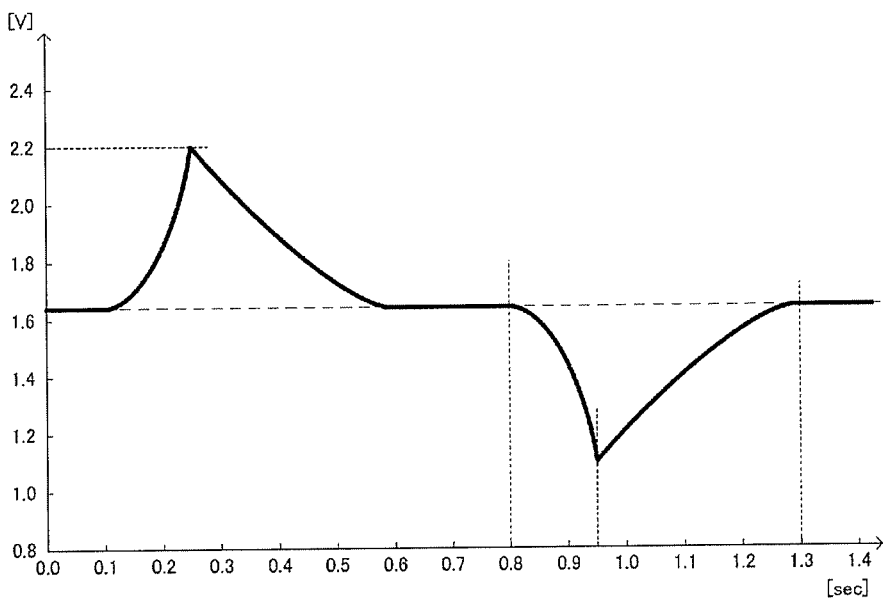
FIG. 8 is a view illustrating an example of a temporal transition of an output voltage of an operational amplifier U1 according to a second embodiment.

Even according to this configuration, the output voltage of the operational amplifier U1 shows the same behavior as that of the first embodiment. More specifically, the output voltage of the operational amplifier U1 of the voltage converting unit 101A makes a temporal transition as indicated in FIG. 8. FIG. 8 is a view illustrating an example of a temporal transition of the output voltage of the operational amplifier U1 according to the present embodiment. In addition, FIG. 8 illustrates that a pressing force is applied in a first direction at time 0.1 sec. to 0.25 sec., then the pressing force is maintained and the pressing force is released at time 0.8 sec. to 0.95 sec.

As illustrated in FIG. 8, the pressing force is not applied to the piezoelectric element 10 at time 0.0 sec. to 0.1 sec., and the output voltage is the reference voltage.

When the pressing force is applied to the piezoelectric element 10 at time 0.1 sec. to 0.25 sec., the output voltage rises compared to the reference voltage in proportion to the applied pressing force. Further, when the pressing force does not further increase and becomes fixed, the output voltage lowers at a time constant based on R4×C1 and returns to the reference voltage. In case of, for example, FIG. 8, the output voltage reaches the reference voltage at 0.6 sec. Subsequently, the output voltage keeps the reference voltage and fixed in a period in which the pressing force is fixed.

When the pressing force applied to the piezoelectric element 10 is released at time 0.8 sec. to 0.95 sec., the output voltage lowers compared to the reference voltage in proportion to the pressing force to be released. Further, when the pressing force is completely released, the output voltage rises at a time constant based on R4×C1 and returns to the reference voltage. In case of, for example, FIG. 8, the output voltage reaches the reference voltage at 1.3 sec.

The output voltage which makes the above temporal transition due to the pressing force applied to the piezoelectric element 10 is inputted to the detecting unit 102.

Figure 9:
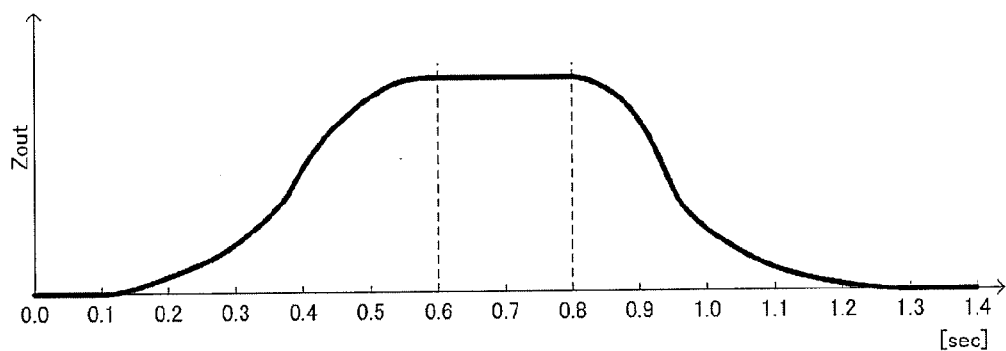
FIG. 9 is a view illustrating a temporal transition of an integration value Zout obtained by a computing unit 122 according to the second embodiment.

The detecting unit 102 employs the same configuration as that of the first embodiment. FIG. 9 is a view illustrating a temporal transition of an integration value Zout obtained by a computing unit 122 according to the second embodiment. FIG. 9 illustrates an example where an output voltage transition illustrated in FIG. 8 occurs.

As illustrated in FIG. 9, the integration value Zout starts at nearly 0.0 and continues rising until the output voltage rises when the pressing force starts being applied, the pressing force becomes fixed and the output voltage returns to the reference voltage. In this regard, a value which the integration value Zout reaches depends on the pressing force, i.e., the amount of pushing. Subsequently, the integration value Zout continues lowering until the output voltage lowers when the pressing force starts being released and the output voltage returns to the reference voltage when the pressing force is released, and reaches nearly 0.0. Accordingly, in case of FIG. 9, the integration value Zout continues rising from 0.0 to a predetermined value corresponding to the pressing force by 0.6 sec. The integration value Zout is fixed from 0.6 sec. to 0.8 sec. The integration value Zout continues lowering from the predetermined value from 0.8 sec., and reaches 0.0 at 1.3 sec.

Thus, it is possible to obtain a transition of an integration value corresponding to the amount of pressing and the pressing force similar to the first embodiment even when the present embodiment is used. Meanwhile, the voltage converting unit 101A has integration characteristics in the present embodiment, so that it is possible to realize a touch sensor showing a more moderate reaction than that of the first embodiment.

Figure 10:
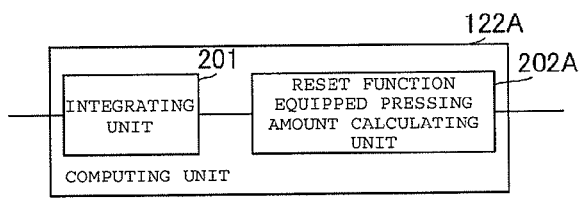
FIG. 10 is a circuit block diagram of a computing unit 122A of a displacement according to a third embodiment.

Next, a touch sensor according to the third embodiment will be described with reference to the drawings. FIG. 10 is a circuit block diagram of a computing unit 122A of the touch sensor according to the present embodiment. The touch sensor according to the present embodiment differs from the touch sensor described in the first embodiment, in a configuration of the computing unit 122A. Hence, only differences will be described.

The computing unit 122A has an integrating unit 201 and a reset function equipped pressing amount calculating unit 202A.

Figure 11:
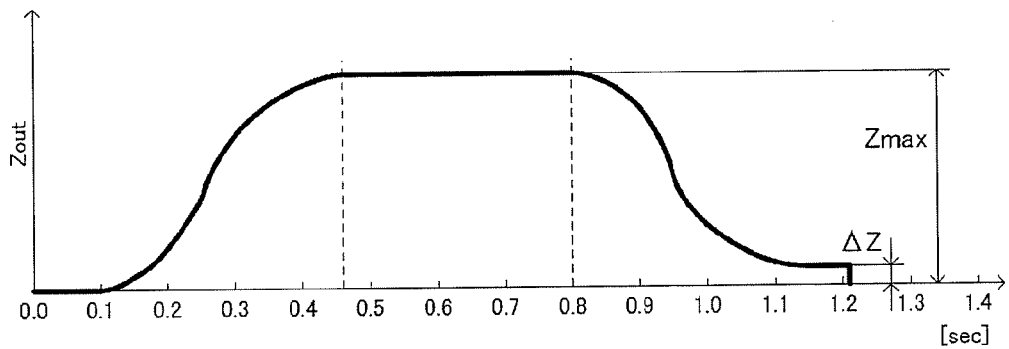
FIG. 11 is a view illustrating one transition which could occur upon actual measurement and is seen in an integration value.

FIG. 11 is a view illustrating one transition which could occur upon actual measurement and is seen in an integration value. Upon actual measurement, due to a variation of the amount of charges generated by the piezoelectric element 10 and an input offset voltage of the operational amplifier U1, a voltage generated in a region higher than the reference voltage (a voltage closer to a positive side than the reference voltage) and a voltage generated in a region lower than the reference voltage (a voltage closer to a negative side than the reference voltage) become asymmetric in some cases. In this case, the integration value Zout is not likely to return to 0.0 as illustrated in FIG. 11 only by way of pressing and releasing.

Figure 12:
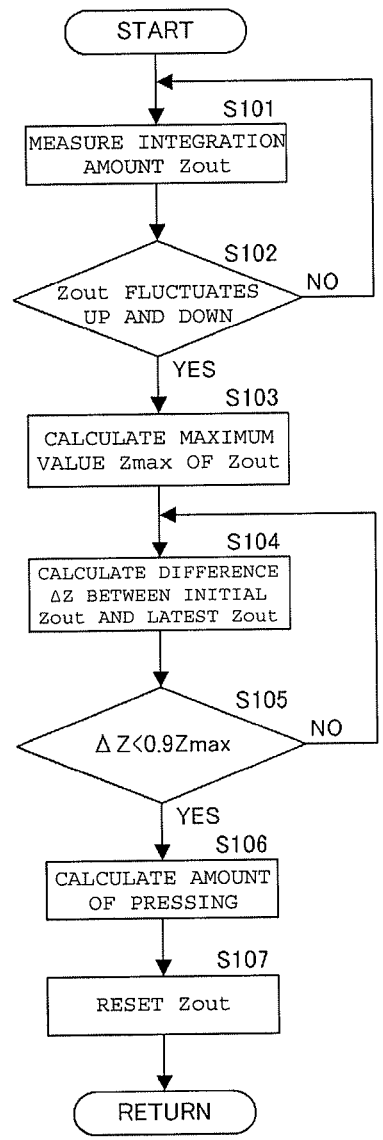
FIG. 12 is a flowchart illustrating a pressing amount calculating flow executed by a reset function equipped pressing amount calculating unit 202A of the displacement sensor according to the third embodiment.

The reset function equipped pressing amount calculating unit 202A of the computing unit 122A calculates the amount of pressing using a flowchart illustrated in FIG. 12. FIG. 12 is a flowchart illustrating a pressing amount calculating flow executed by the reset function equipped pressing amount calculating unit 202A according to the third embodiment.

The reset function equipped pressing amount calculating unit 202A (simply referred to as the "calculating unit 202A" below) measures an integration value Zout outputted from the integrating unit 201, and sequentially compares the integration values Zout (S101). The calculating unit 202A continues measuring and comparing the integration values Zout until the calculating unit 202A detects that the integration value Zout fluctuates up and down (S102: NO). That is, as illustrated in FIG. 6, until the integration value Zout rises, takes a fixed value and then lowers, the calculating unit 202A continues measuring and comparing the integration values Zout.

When detecting that the integration value Zout fluctuates up and down (S102: YES), the calculating unit 202A calculates a maximum value Zmax of the integration value Zout (S103).

Next, the calculating unit 202A calculates a difference value ΔZ between the initial integration value Zout (=0.0) and the latest integration value Zout which is being measured (S104). The calculating unit 202A continues calculating the difference value ΔZ and comparing the difference value ΔZ and a threshold when the difference value ΔZ is not less than the predetermined threshold (0.9 Zmax in the present embodiment) determined based on the maximum value Zmax (S105: NO). In addition, the threshold is not limited to a value described herein, and only needs to be adequately set depending on characteristic variations of the piezoelectric element 10 and the operational amplifier U1 of a touch sensor 100 or use environment of the touch sensor 100.

The calculating unit 202A calculates the amount of pressing from the maximum value Max (S106) when detecting that the difference value ΔZ is less than the threshold (S105: YES). Further, the calculating unit 202A resets the integration value Zout to an initial value (=0.0) (S107).

It is possible to eliminate a cumulative error of integration values by performing such processing. Consequently, even when the amount of pressing is continuously detected, it is possible to continue accurately and reliably detecting the amount of pressing each time.

In addition, although an example of a touch sensor which detects the pressing force (the amount of pushing) has been described above as a displacement sensor, the above configuration is applicable to displacement sensors, i.e., other displacement sensors which detect the amount of displacement caused when a piezoelectric element is bent or twisted. Consequently, it is possible to accurately and reliably detect the amount of displacement such as the amount of bending and the amount of twisting.

DESCRIPTION OF REFERENCE SYMBOLS 100, 100A TOUCH SENSOR
10 PIEZOELECTRIC ELEMENT
20 PIEZOELECTRIC FILM
31 FIRST DETECTION ELECTRODE
32 SECOND DETECTION ELECTRODE
41 FIRST LEAD ELECTRODE
42 SECOND LEAD ELECTRODE
50 ELASTIC BODY
101, 101A VOLTAGE CONVERTING UNIT
102 DETECTING UNIT
121 A/D CONVERTING UNIT
122, 122A COMPUTING UNIT
201 INTEGRATING UNIT
202 PRESSING AMOUNT CALCULATING UNIT
202 A RESET FUNCTION EQUIPPED PRESSING AMOUNT CALCULATING UNIT
501 SUPPORT MEMBER

The invention claimed is:

1. A displacement sensor comprising:
a piezoelectric element that generates a charge proportional to an amount of displacement of the piezoelectric element;
a voltage converting circuit that generates voltages from the charge generated by the piezoelectric element; and
a detecting unit that integrates the voltages generated from the voltage converting circuit to calculate an integration value and detects the amount of the displacement of the piezoelectric element based on the calculated integration value,
wherein the detecting unit is configured to:
measure a fluctuation of the integration value; and
calculate a difference value by calculating a difference between an initial value of the integration value and a latest integration value when the fluctuation of the integration value shows an increase or a decrease of the integration value.

2. The displacement sensor according to claim 1, wherein the voltages generated by the voltage converting circuit change at a time constant.

3. The displacement sensor according to claim 1, wherein the voltage converting circuit comprises:
a first resistor coupled to the piezoelectric element;
a second resistor coupled to the fist resistor; and
an amplifier circuit having an inverting input coupled to a node between the first and second resistor and a non-inverting input coupled to a voltage source.

4. The displacement sensor according to claim 3, wherein the second resistor has a first end coupled to the first resistor and a second end coupled to an output of the amplifier circuit.

5. The displacement sensor according to claim 4, wherein an output of the amplifier circuit is coupled to the detecting unit.

6. The displacement sensor according to claim 3, wherein a synthetic resistance of the first resistor and the second resistor is lower than an impedance of the piezoelectric element.

7. The displacement sensor according to claim 1, wherein the detecting unit is further configured to reset the integration value to the initial value when the difference value is less than a predetermined threshold.

8. The displacement sensor according to claim 1, wherein the piezoelectric element comprises:
a piezoelectric film composed of polylactic acid subjected to stretch processing in at least a uniaxial direction;
a first detection electrode disposed on a first surface of the piezoelectric film; and
a second detection electrode disposed on a second surface of the piezoelectric film.

9. The displacement sensor according to claim 1, wherein the displacement sensor is a touch sensor that detects a pressing force.

10. A displacement sensor comprising:
a piezoelectric element that generates a charge proportional to an amount of displacement of the piezoelectric element
a voltage converting circuit that generates voltages from the charge generated by the piezoelectric element, wherein the voltage converting circuit comprises:
a first resistor coupled in parallel to the piezoelectric element; and
an amplifier circuit that detects an input voltage generated when the charge generated by the piezoelectric element flows in the first resistor; and
a detecting unit that integrates the voltages generated from the voltage converting circuit to calculate an integration value and detects the amount of the displacement of the piezoelectric element based on the calculated integration value.

11. The displacement sensor according to claim 10, wherein a first end of the first resistor is coupled to an input of the amplifier circuit and a second end of the first resistor is coupled to a reference potential.

12. The displacement sensor according to claim 11, wherein an output of the amplifier circuit is coupled to the detecting unit.

13. The displacement sensor according to claim 12, further comprising a pair of resistors in series and coupled to the reference potential and the first resistor coupled to the piezoelectric element is further coupled to a node between the pair of resistors.

14. The displacement sensor according to claim 13, further comprising a capacitor coupled in parallel to the first resistor.

15. The displacement sensor according to claim 14, wherein the pair of resistors have resistance values R1 and R2 and the first resistor has a resistance value R3, and $R1 \times R2/(R1+R2) << R3$.

16. The displacement sensor according to claim 12, wherein the output of the amplifier circuit is further coupled to an inverting input of the amplifier circuit.

17. The displacement sensor according to claim 10, wherein an impedance of the first resistor coupled to the piezoelectric element is lower than an impedance of the piezoelectric element.

* * * * *